United States Patent
Ruelke et al.

(10) Patent No.: US 7,251,468 B2
(45) Date of Patent: Jul. 31, 2007

(54) DYNAMICALLY MATCHED MIXER SYSTEM WITH IMPROVED IN-PHASE AND QUADRATURE (I/Q) BALANCE AND SECOND ORDER INTERCEPT POINT (IP2) PERFORMANCE

(75) Inventors: Charles R. Ruelke, Margate, FL (US); Nicholas G. Cafaro, Coconut Creek, FL (US); Robert E. Stengel, Pompano Beach, FL (US)

(73) Assignee: Motorola, Inc., Schaumburg, IL (US)

( * ) Notice: Subject to any disclaimer, the term of this patent is extended or adjusted under 35 U.S.C. 154(b) by 471 days.

(21) Appl. No.: 10/890,691

(22) Filed: Jul. 14, 2004

(65) Prior Publication Data

US 2006/0014515 A1   Jan. 19, 2006

(51) Int. Cl.
     *H04B 1/10* (2006.01)
(52) U.S. Cl. .................. 455/296; 455/310; 455/311
(58) Field of Classification Search ............ 455/295, 455/296, 311, 312, 313, 330; 327/317, 359

See application file for complete search history.

(56) References Cited

U.S. PATENT DOCUMENTS

| | | | | |
|---|---|---|---|---|
| 5,859,559 A | * | 1/1999 | Hong et al. | 327/359 |
| 6,125,272 A | * | 9/2000 | Bautista et al. | 455/326 |
| 6,933,766 B2 | * | 8/2005 | Khlat et al. | 327/359 |
| 2004/0246047 A1 | * | 12/2004 | Manku et al. | 329/315 |
| 2005/0272394 A1 | * | 12/2005 | Heck | 455/314 |

* cited by examiner

*Primary Examiner*—Duc M. Nguyen

(57) ABSTRACT

A dynamically matched mixer system (200) for use in a direct conversion radio frequency (RF) receiver includes a frequency generator (201, 203, 205) that includes plurality of dividers (407) for providing differential local oscillator reference sources ($F_{LO+}$ and $F_{LO-}$) and mitigation frequency reference sources (F1 and F2) from reference oscillator (205). A mixer (209) mixes the differential local oscillator reference sources ($F_{LO+}$ and $F_{LO-}$) and the mitigation frequency reference sources (F1 and F2) while dynamic matching units (211, 213) are used for receiving the mitigation frequency reference sources and matching switching parameters of differential input signals ($I_{RF+}$ and $I_{RF-}$) and differential baseband output signals ($I_{BB+}$ and $I_{BB-}$). The frequencies of the mitigation frequency reference sources (F1 and F2) are selected so as to establish a non-integer relationship to the reference oscillator (201) for mitigating the occurrence of interference with $F_{LO+}$ and $F_{LO-}$.

20 Claims, 4 Drawing Sheets ered and PLL 103 represent a phase locked loop
DYNAMICALLY MATCHED MIXER SYSTEM WITH IMPROVED IN-PHASE AND QUADRATURE (I/Q) BALANCE AND SECOND ORDER INTERCEPT POINT (IP2) PERFORMANCE

TECHNICAL FIELD

This invention relates in general to radio frequency (RF) mixers and more particularly to a system and method for mitigating signal spur interference between input signals in an RF mixer.

BACKGROUND

Present direct conversion receiver (DCR) architectures often incorporate a dynamically matched architecture that uses a single reference signal source which operates at two times the carrier frequency. This generates both the local oscillator (LO) signal and a mitigation frequency reference signal which is typically less than 300 MHz. To avoid "self quieting" interference between the LO and the mitigation signals as well as their harmonics, the mitigation frequency reference signal is generated by using odd integer dividers to generate odd integer sub-multiples of the voltage controlled oscillator (VCO) frequency. The LO frequency is generated by dividing down the VCO frequency by an even multiple for an even integer divider or by an odd multiple for an odd multiple divider. While this arrangement is typically used in DCR architectures, further optimization is necessary to provide margin to system receiver requirements such as terrestrial trunked radio (TETRA) blocking and frequency modulated digital private line (FM DPL) distortion mitigation. In-phase (I) and quadrature (Q) matching directly influences sideband suppression which, in turn, directly affects the generation of sub-audible signaling distortion products. In addition, excessive I and Q mismatch can degrade second order intercept point (IP2) performance which bears directly on the receiver's interference blocking performance.

Prior art dynamically matched mixer systems include U.S. Pat. No. 6,125,272 to Bautista et al. that teaches a method and apparatus for providing improved intermodulation distortion protection. U.S. Pat. No. 6,125,272 is herein incorporated by reference. The prior art techniques involve the use of dynamic matching to transform coefficients of the IM2 distortion from constant values into functions of time where they may be handled by known rejection techniques. This involves using odd and even integer dividers used to divide down from a single VCO source so that an even division multiple is used with the LO and the odd division multiple is used for quadrature generation. Thus, there is a finite point at which the divider multiple will create an even multiple mixed with the odd multiple causing a "spur" which self quiets the receiver. This relationship between even and odd frequency relationship can be a problem in this type of design. The system as defined by Bautista et al. limits the overall benefit of this dynamically matched mixer design since it decreases the receiver's IP2 performance by randomizing the second order distortion product. Thus, Bautista et al. fail to address system level implementation issues that can degrade I/Q channel matching due to mitigation coupling between the LO quadrature generation circuitry and reference signal mitigation circuitry.

The prior art dynamically matched differential I channel mixer 100 is illustrated in prior art FIG. 1, where reference oscillator 101 and PLL 103 represent a phase locked loop that provides a stable radio frequency (RF) source at some predetermined frequency. The PLL 103 provides differential inputs to a plurality of frequency harmonic dividers namely $N_{even}$ divider 105 and $N_{odd}$ divider 107. Each respective harmonic divider provides a means to provide an even or odd multiple harmonic frequency from the source provided by PLL 103. The output of the $N_{even}$ divider 105 provides local oscillator (LO) differential inputs ($F_{LO+}$ and $F_{LO-}$) to a mixer 109 while the output of the $N_{odd}$ divider 107 supplies a mitigation signal (F1) to both the dynamic matching network 111 and the dynamic matching network 113.

As will be recognized by those skilled in the art, the mixer 109 is a standard Gilbert cell mixer which enables differential RF input signals ($I_{RF+}$ and $I_{RF-}$) to be mixed with both the LO differential signal ($F_{LO+}$ and $F_{LO-}$) and mitigation signal F1. The dynamic matching network 111 and dynamic matching network 113 are essentially a switching network. These switching networks switch between transistor components within the in-phase (I) or quadrature (Q) mixer branches so as to average imperfections in the mixer's components to provide substantially enhanced mixer linearity. A plurality of alternating current (AC) couplers 115, 116 are used to couple the mixer 109 and dynamic matching network 113 which helps to eliminate temperature compensating direct current (DC) mismatch, improves system common mode rejection of the dynamic mixer and eliminates the use of an 1/f noise adder by the LO. Finally, the differential baseband output signals ($I_{BB+}$ and $I_{BB-}$) for either an in-phase or quadrature channel is provided at an output of the dynamic matching network 113. As noted with other prior art designs, the circuit topology of prior art FIG. 1 creates a spur which causes problems depending on what harmonics are used at the LO and the mitigation signal F1. As will be recognized by those skilled in the art, prior art FIG. 1 shows a differential I-channel mixer while a differential Q-channel mixer will be similarly configured.

Therefore, it would be advantageous to provide a system and method of using a dynamic matched mixer which provides improved second order intermodulation distortion (IP2) performance. It would also be advantageous to apply this system and method to wireless and wireline communications devices that employ mixer circuits, switches, and other components that exhibit parametric mismatch or imbalance.

SUMMARY OF THE INVENTION

Briefly, according to the invention, there is provided a direct conversion receiver architecture incorporating a dynamically matched mixer where the local oscillator and mitigation signal frequency are generated from non-integer related sources. This can include either two independent frequency generation units or using a direct digital synthesizer (DDS) with multiple independent outputs derived from a digital-to-time converter. This enables a single high frequency and high stability reference oscillator to drive a series of delay line structures of sufficient quantity to provide resolution in generating the targeted frequency. The DDS with digital-to-time conversion provides performance benefits in terms of flexibility, signal quality, integration, die area and current drain. The advantages of the invention include eliminating the need for a single frequency generation unit (FGU) to drive both the LO and mitigation frequency reference sources, real time variation of mitigation frequency to eliminate interference and increased flexibility in the selection of the mitigation frequency relative to the LO. This allows fractional selection of the mitigation rate.

The architecture incorporates a single high frequency reference for generating multiple frequency sources to drive a differential DCR mixing structure.

BRIEF DESCRIPTION OF THE DRAWINGS

The features of the present invention, which are believed to be novel, are set forth with particularity in the appended claims. The invention, together with further objects and advantages thereof, may best be understood by reference to the following description, taken in conjunction with the accompanying drawings, in the several figures of which like reference numerals identify like elements, and in which:

DETAILED DESCRIPTION OF THE PREFERRED EMBODIMENT

Figure 1:
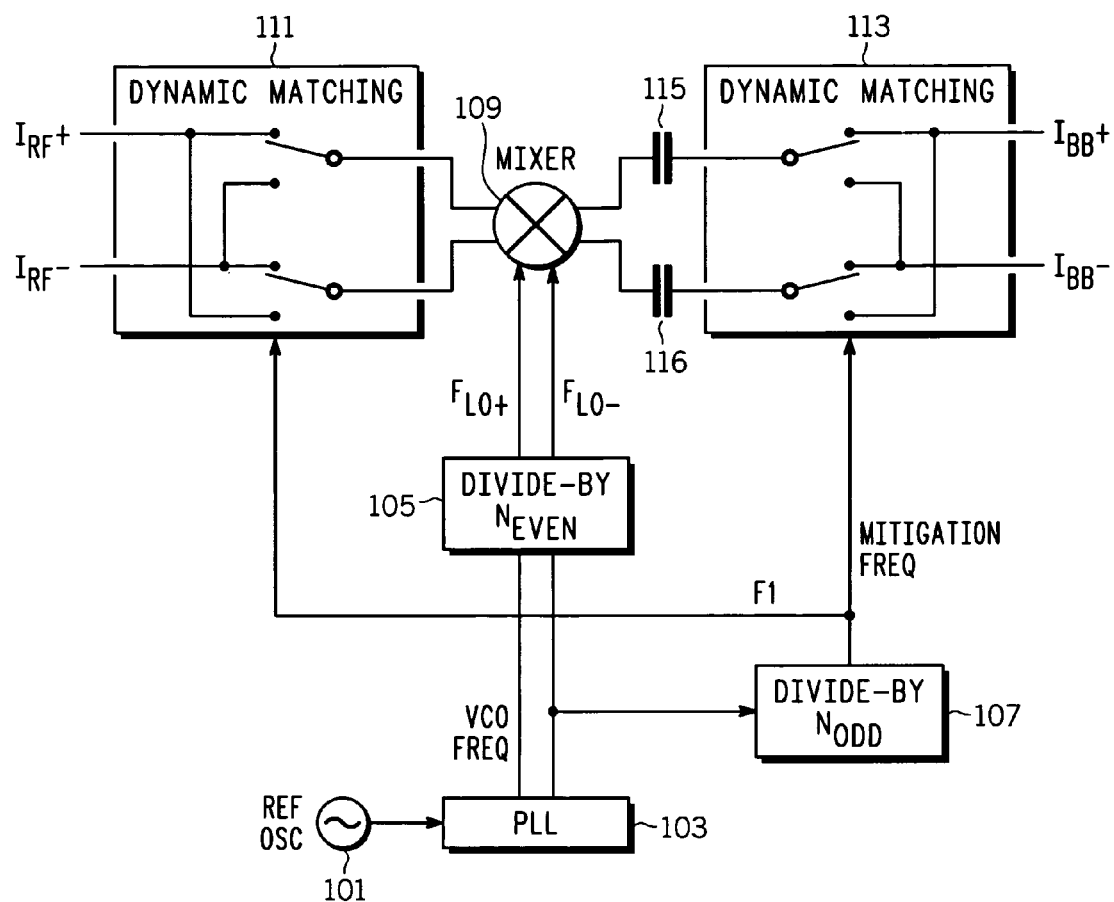
FIG. 1 is a prior art block diagram illustrating a dynamically matched balance mixer known in the prior art.

While the specification concludes with claims defining the features of the invention that are regarded as novel, it is believed that the invention will be better understood from a consideration of the following description in conjunction with the drawing figures, in which like reference numerals are carried forward.

Figure 2:
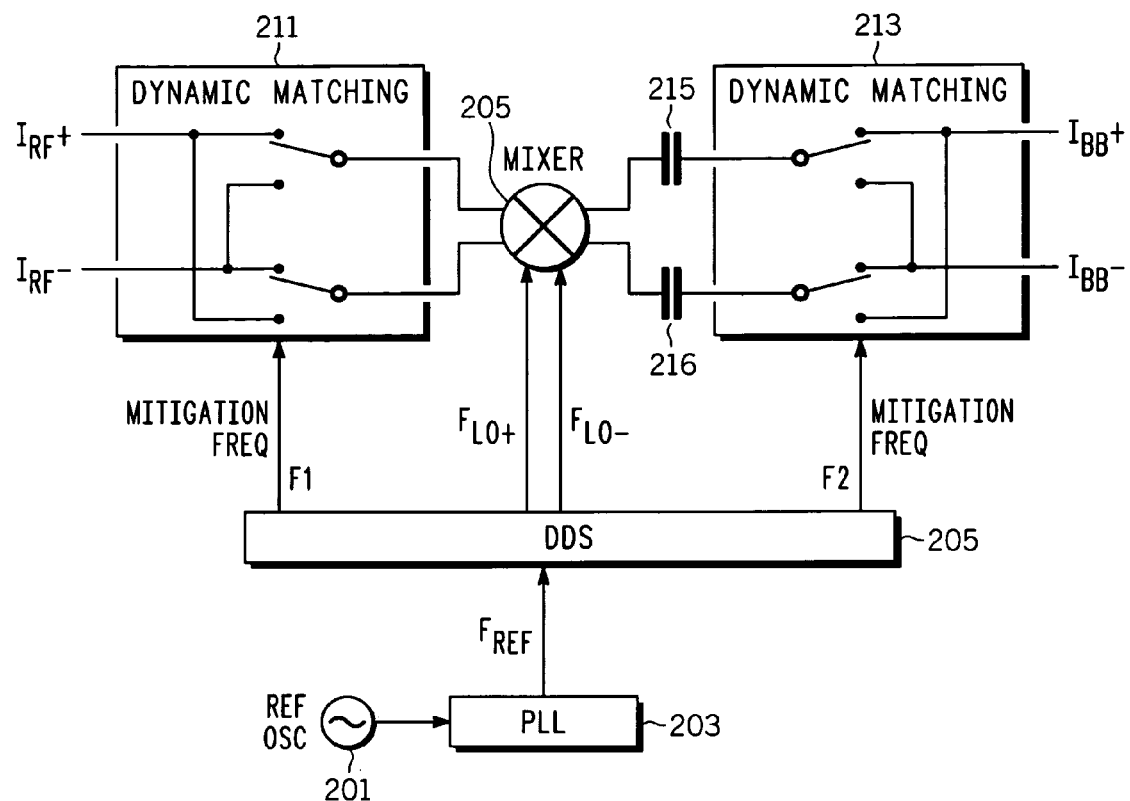
FIG. 2 is a block diagram illustrating a dynamically matched mixer system according to the preferred embodiment of the invention.

Referring now to FIG. 2, the dynamically matched mixer system with improved I/Q balance and IP2 performance 200 includes a reference oscillator 201 coupled to a phase locked loop (PLL) 203 that generates a high frequency reference signal $F_{ref}$. This $F_{ref}$ signal provides an input to the direct digital synthesizer (DDS) 205. The DDS 205 employs a delay locked loop that allows for the generation of multiple independent output frequencies, namely, differential local oscillator signals ($F_{LO}+$ and $F_{LO}-$) and a first mitigation reference signal F1 and a second mitigation reference signal F2. These outputs are non-integer related to one another and the $F_{ref}$. The $F_{ref}$ signal PLL 203 and the DDS 205 form a highly stable and versatile frequency generation unit (FGU). As compared with the typical PLL as shown in prior art FIG. 1, the DDS 205 operates to mitigate spur interference through the intelligent selection of the first mitigation frequency signal F1 and the second mitigation frequency signal F2. This is accomplished by using a digital processing circuit (FIG. 4) to select taps from a tapped delay line (not shown) in an organized manner such that the differential frequency signals ($F_{LO}+$ and $F_{LO}-$), the first mitigation signal F1 and the second mitigation signal F2 are provided according to the following equations:

$$F_{LO(+ \text{ and } -)} = F_{ref}/N1$$

$$F1 = F_{ref}/N2; \text{ and}$$

$$F2 = F_{ref}/N3 \text{ where } N1, N2 \text{ and } N3 \text{ are real numbers.}$$

As will be recognized by those skilled in the art, for direct conversion receiver (DCR) applications:

$$F_{LO(+ \text{ or } -)} = F_{RF} \text{ and } N3 = N2; \text{ and}$$

Very Low Frequency Intermediate Frequency (VLIF) applications:

Where N3≠N2 then $$F_{LO(+ \text{ or } -)} = F_{RF} \text{ then } F_{VLIF} = (F2 - F3); \text{ and}$$

$$F_{LO} \neq F_{RF}, \text{ then } F_{VLIF} = +/- F_{RF} - /+ \{F_{LO} + /-(F2-F3)\}$$

The VLIF strategy is a specialized application of DCR where the RF, LO and mitigation frequencies are selected such that the output $I_{BB+}$ and $I_{BB-}$ are typically 100's of kHz. VLIF strategies are typically used in global system for mobile communication (GSM) receiver mixers where the receiving protocol does not utilize contiguous occupied channels. As is known in the art, the GSM protocol specifies that certain adjacent frequency channels may be "open" or unoccupied. Thus, the $F_{LO}+/-$ or a mitigation signal as described herein may be selected such that any spurious response falls in the unoccupied channel spectrum thus mitigating any undesired interference. This creates a great deal of extra flexibility in the intermediate frequency selection of the GSM mixer.

As illustrated in FIG. 2, the dynamically matched mixer system 200 includes the differential local oscillator signals ($F_{LO}+$ and $F_{LO}-$) that are provided to a mixer 209. A first mitigation reference signal F1 is supplied from the DDS 205 to the input dynamic matching network 211. The dynamic matching network 211 provides a differential input signal ($I_{RF}+$ and $I_{RF}-$) to the mixer 209 which is then coupled through AC couplers 215, 216 to the output dynamic matching network 213. Similarly, a second mitigation reference signal F2 is supplied from the DDS 205 to the output dynamic matching network 213. The differential output signals ($I_{BB}+$ or $I_{BB}-$) of the output dynamic matching network 213 represent either an in-phase or quadrature baseband output signal depending upon which type of mixer is used for the representative digital channel.

Figure 3:
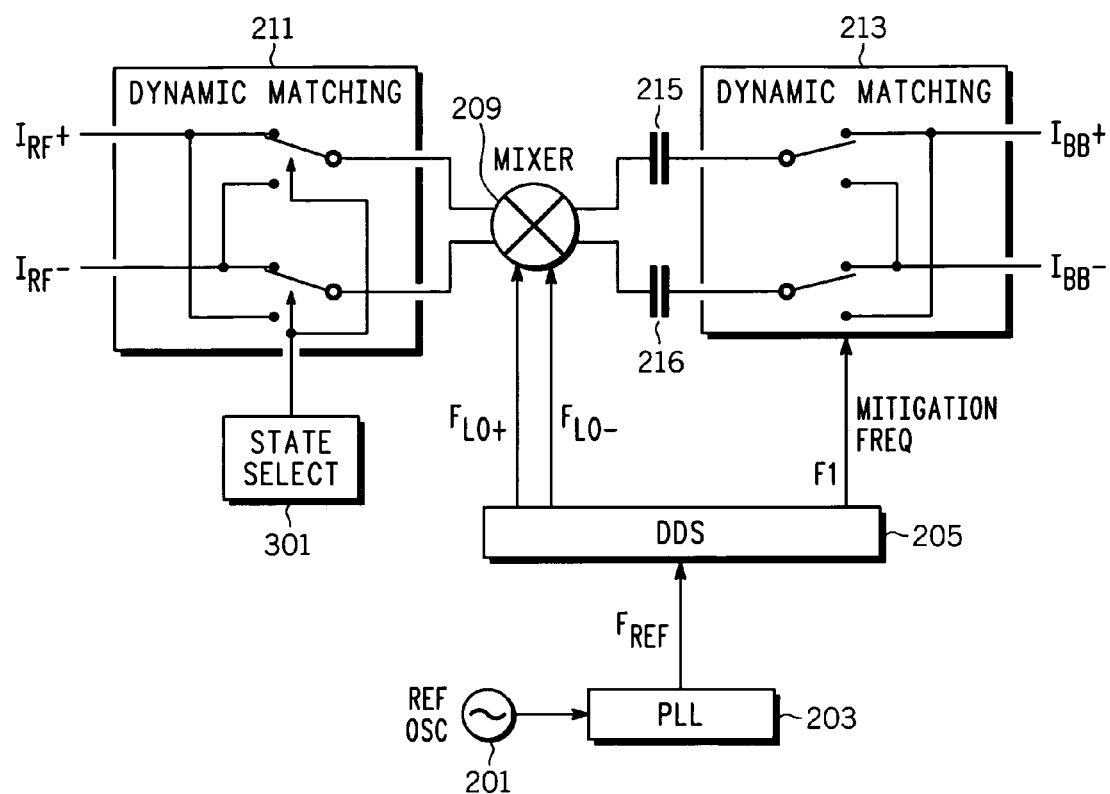
FIG. 3 is a block diagram shown a dynamically matched mixer system according to an alternative embodiment of the invention.

FIG. 3 illustrates a block diagram of the dynamically matched mixer system 300 according to an alternative embodiment of the invention. As noted in FIG. 2, the reference oscillator ($F_{ref}$) 205, the PLL 203 and the DDS 205 work to provide a differential local oscillator signal ($F_{LO}+$ and $F_{LO}-$) as well as a mitigation signal F 1. This embodiment differs from that of FIG. 2, through the use of a state selection manager 301. The state select manager 301 operates to control the input dynamic matching network 211 in order to preset the state of the switch to a "low" or "high" state. This fixes the state of the switch without any time dependence that would occur with the use of a mitigation signal. The use of the state select manager 301 permits the input signal to no longer be dynamically matched to the input stage to the mixer 209. This operationally simplifies the dynamically matched mixer system 300 by minimizing the spurious signal contributions of the input dynamic matching network 211 and improving overall IP2 performance over that achieved using a classic single mixer topology. Thus, the embodiment as shown in FIG. 3 while using only one switching network, namely, output dynamic switching network 213, allows substantially the similar performance to the dual switching network topology shown in FIG. 2 if the local oscillator frequency ($F_{LO}+$ and $F_{LO}-$) and mitigation signal frequency (F1) are carefully selected.

Figure 4:
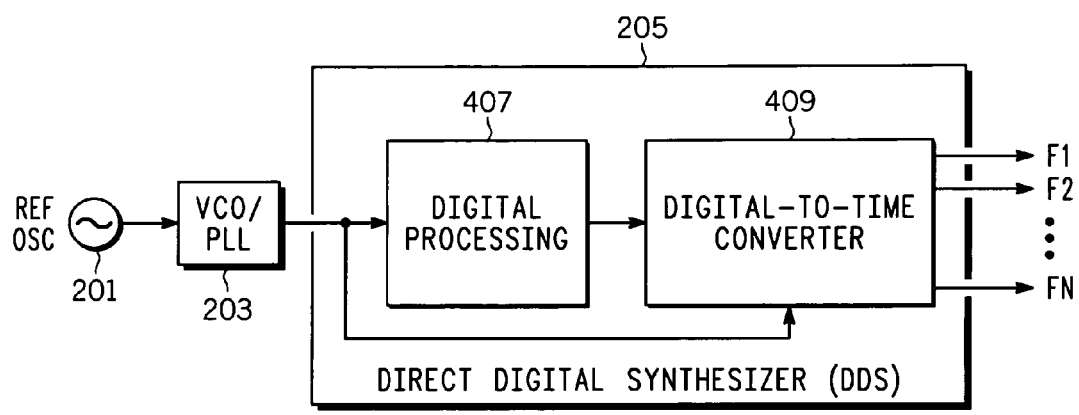
FIG. 4 is a block diagram of a multiple frequency generation unit as utilized in the preferred embodiment of the invention.

FIG. 4 illustrates a block diagram showing details of a multiple frequency generation unit (FGU) 400 used in accordance with the dynamic match mixers as describer herein. As illustrated in FIGS. 2 and 3, a reference oscillator 201 supplies a reference signal to a voltage controlled oscillator (VCO) which is a high stable PLL oscillator producing an $F_{ref}$ signal. The $F_{ref}$ is supplied to the direct digital synthesizer (DDS) 205. The DDS 205 is comprised of a digital processor 407 and a digital-to-time converter 409. The multiple frequency generation unit 400 utilizes a DDS synthesizer 205 where each output (F1 to FN) is independent yet is derived from a signal high frequency reference ($F_{ref}$). A principal benefit of this topology is that only the single VCO 203 is required. An output signal is constructed when the digital processor 407 selects taps from the digital-to-time converter 409 which is a tapped delay line. The use of this system and method of frequency generation yields a number of benefits, namely, high frequency resolution, broad frequency tuning range and low current drain, as compared with other DDS synthesizers. Moreover, there is a phase coherent relationship between the differential local oscillator frequency ($F_{LO}+$ and $F_{LO}-$) and the mitigation signal frequency (F2) and there is an ability to phase shift the output of the DDS 205 relative to one another. The DDS 205 also enables the system to provide both quadrature and differential signals. Finally, a major benefit in using the DDS 205 is spur mitigation through the intelligent selection of the mitigation frequency signal (F2).

Thus, the present invention provides a fractional non-harmonic frequency generation architecture with independent mitigation and LO frequency paths. The non-harmonic fractional relationship between the mitigation and LO frequencies enhances I/Q matching and IP2 performance over a wide range of RF bandwidths. The digital nature of the frequency synthesizer allows for "dithering" or spreading capabilities of the mitigation frequency to reduce discrete harmonic spurious content that would otherwise be mixed into the base band signal. Moreover, agile interference rejection enhancement allows very fast adjustment of the mitigation frequency in real time relative to the LO. Hence, spurious interference can be detected, e.g., degraded bit error rate (BER) in strong signal conditions where the mitigation frequency can be adjusted to a new frequency unrelated to the local oscillator while still receiving the desired signal in an attempt to eliminate the interference.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A dynamically matched radio frequency (RF) mixer system compnsing:
   a reference signal generator for providing a plurality of independent signal reference sources based on a reference oscillator, wherein the plurality of independent signal reference sources comprises at least a first reference signal source, a second reference signal source and a third reference signal source; and
   at least one mixer for mixing the first reference signal source, the second reference signal source and the third reference signal source;
   wherein the frequencies of the first reference signal source, the second reference signal source and third reference signal source are selected so as to be non-integer related to the frequency of the reference oscillator, and
   wherein the frequencies of the first reference signal source, the second reference signal source and, third reference signal source are selected so as to be non-integer related, thereby mitigating the occurrence of self generating interference.

2. A dynamically matched RF mixer system as in claim 1, wherein the first reference source is a local oscillator.

3. A dynamically matched RF mixer system as in claim 2, wherein the second frequency reference source is a mitigation signal reference.

4. A dynamically matched RF mixer system as in claim 2, wherein the third frequency reference source is a mitigation signal reference.

5. A dynamically matched RF mixer system as in claim 1, further compnsing:
   a plurality of dynamically matching units for matching the switching characteristics of an RF input signal to a baseband output signal.

6. A dynamically matched RF mixer system as in claim 5, wherein the second reference source and the third reference signal source are provided to the plurality of dynamically matching units.

7. A dynamically matched RF mixer system as in claim 5, further comprising a coupler for coupling the mixer and at least one of the plurality of dynamically matching units for improving common mode rejection of the mixer system.

8. A dynamically matched RF mixer system as in claim 1, wherein the reference signal generator includes a plurality of frequency dividers for dividing the frequency of the reference oscillator to the plurality of independent reference sources.

9. A dynamically matched RF mixer system as in claim 1, wherein the signal generator further includes a voltage controlled oscillator (VCO) for providing a controlled reference source to the plurality of frequency dividers.

10. A dynamically matched RF mixer system as in claim 1, wherein the reference signal generator is a direct digital synthesizer (DDS).

11. A dynamically matched mixer system comprising:
    a frequency generation unit for providing a local oscillator reference source and at least one mitigation frequency reference source from a reference oscillator in a direct conversion radio frequency (RF receiver;
    at least one switching mixer for mixing the local oscillator reference source and the at least one mitigation frequency reference source; and
    at least one dynamic matching unit for receiving the at least one mitigation frequency reference source for matching switching parameters of an RF input signal and a baseband output signal;
    wherein the frequencies of the at least one mitigation frequency reference source is are selected so as to establish a non-integer relationship to the reference oscillator frequency for mitigating the occurrence of spurious interference with the local oscillator reference source, and
    wherein the frequencies of the at least one mitigation frequency reference source are selected so as to establish a non-integer relationship to the frequencies of one another for mitigating the occurrence of self generated interference.

12. A dynamically matched mixer system as in claim 11, wherein the at least one dynamic matching unit is fixed switchable between an on and off state.

13. A dynamically matched mixer system as in claim 11, wherein the at least one dynamic matching unit is at the output of the at least one mixer.

14. A dynamically matched mixer system as in claim 11, further comprising a coupler between the at least one mixer and the at least one dynamic matching unit for improving common mode rejection of the system.

15. A dynamically matched mixer system as in claim 11, wherein the at least one mixer is a Gilbert mixer.

16. A dynamically matched mixer system as in claim 11, wherein the frequency generation unit is a direct digital synthesizer (DDS).

17. A method for dynamically matching a mixer system for use with a radio frequency (RF) receiver comprising the steps of:
   providing a frequency generation unit having a reference oscillator;
   dividing the frequency of the reference oscillator using a plurality of dividers to produce both a local oscillator reference source and a mitigation frequency reference source;
   selecting the frequency of the mitigation frequency reference source such that it is non-integer related to the operating frequency of the reference oscillator and the local oscillator reference source; and
   applying the local oscillator reference source and the mitigation frequency reference source to at least one mixer.

18. A method for dynamically matching a mixer system as in claim 17, further including the step of:
   applying the mitigation frequency reference source to a plurality of dynamic matching networks for matching the switching characteristics of an RF input signal to a baseband output signal.

19. A method for dynamically matching a mixer system as in claim 18, further including the step of:
   coupling the at least one mixer with one of the plurality of dynamic matching networks with an alternating current (AC) coupling device for improving the common mode rejection of the mixer system.

20. A method for dynamically matching a mixer system as in claim 17, wherein the local oscillator reference source and the mitigation frequency reference source are produced by a direct digital synthesizer (DDS).

\* \* \* \* \*